(12) United States Patent
Doerrer et al.

(10) Patent No.: US 7,227,491 B2
(45) Date of Patent: Jun. 5, 2007

(54) CONTROL APPARATUS AND METHOD FOR SCRAMBLING THE ASSIGNMENT OF THE REFERENCES OF A QUANTIZER IN A SIGMA-DELTA ANALOGUE/DIGITAL CONVERTER

(75) Inventors: Lukas Doerrer, Villach (AT); Markus Schimper, Moosinning (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/276,802

(22) Filed: Mar. 15, 2006

(65) Prior Publication Data
US 2006/0227027 A1  Oct. 12, 2006

(30) Foreign Application Priority Data
Mar. 17, 2005 (DE) .................. 10 2005 012 444

(51) Int. Cl.
*H03M 1/34* (2006.01)
(52) U.S. Cl. ...................... 341/158; 341/155
(58) Field of Classification Search ............. 341/143, 341/144, 154, 155, 118, 120, 158
See application file for complete search history.

(56) References Cited

U.S. PATENT DOCUMENTS

| | | | |
|---|---|---|---|
| 5,138,317 A | 8/1992 | Story | 341/144 |
| 5,221,926 A | 6/1993 | Jackson | 341/118 |
| 6,346,898 B1 * | 2/2002 | Melanson | 341/143 |
| 6,369,733 B1 * | 4/2002 | Tucker et al. | 341/143 |
| 6,816,103 B2 | 11/2004 | Jonsson et al. | 341/160 |
| 2006/0077090 A1 * | 4/2006 | Schimper | 341/155 |

FOREIGN PATENT DOCUMENTS

WO    02/069502    9/2002

OTHER PUBLICATIONS

"Delta Sigma Data Converters" by S. Northworthy, R. Schreier, G. Temes, IEEE Press, NEw York, 1997, pp. 260-264.
"Design of Multibit Delta Sigma A/D Converters" by Y. Geerts et al., Kluver Academic Publishers, Boston 2002, pp. 81-86.

* cited by examiner

*Primary Examiner*—Brian Young
(74) *Attorney, Agent, or Firm*—Baker Botts L.L.P.

(57) ABSTRACT

The control apparatus (8') is used to dynamically assign N individual references to N individual comparators of a quantizer in a sigma-delta analogue/digital converter, the control apparatus (8') generating a digital control signal (9'). The control apparatus (8') has a storage means (12) for providing the value of the control signal (9') at the time k−1, and a summation means (10) for summing the output signal Y of the quantizer with the stored value of the first control signal (9') at the time k−1.

19 Claims, 6 Drawing Sheets

CONTROL APPARATUS AND METHOD FOR SCRAMBLING THE ASSIGNMENT OF THE REFERENCES OF A QUANTIZER IN A SIGMA-DELTA ANALOGUE/DIGITAL CONVERTER

PRIORITY

This application claims priority from German Patent Application No. 10 2005 012 444.5, which was filed on Mar. 17, 2005, and is incorporated herein by reference in its entirety.

TECHNICAL FIELD

The invention relates to a control apparatus and to a corresponding method which are intended to control the dynamic assignment of individual references to individual comparators of a quantizer in a multilevel sigma-delta analogue/digital converter.

BACKGROUND

FIG. 1 illustrates a block diagram of a sigma-delta analogue/digital converter (SD-ADC). The latter comprises a feedback control loop comprising a loop filter 1, a quantizer 2 and a digital/analogue converter 3 (DAC). An analogue signal X is applied to the input of the SD-ADC. The difference between the analogue input signal X and the output signal of the DAC 3 is fed to the analogue loop filter 1 whose output drives the quantizer 2. The output of the quantizer 2 generates an oversampled digital signal Y whose mean value corresponds to the analogue input signal X. The SD-ADC illustrated in FIG. 1 is a multilevel SD-ADC (also called a multibit SD-ADC). In a multilevel SD-ADC, the quantizer 2 has a plurality N of quantization thresholds. If no code conversion is carried out in the quantizer, the output signal Y of the quantizer 2 is a signal having a width of N bits (where N>1), this signal being present in thermometer code. The output signal Y of the quantizer 2 is converted, using the DAC 3, into an analogue signal which is compared with the analogue input signal X. In the steady state of the control loop, the analogue input signal X and the output signal of the DAC 3 correspond to one another.

A code converter (not illustrated) which converts the output signal of the quantizer from the thermometer code representation into the binary code representation is typically connected downstream of the loop illustrated in FIG. 1. In addition, a digital low-pass filter and a decimator (not illustrated) are arranged on the output side of the code converter, the low-pass filter forming a mean value and the decimator reducing the sampling rate.

The effective resolution of the multilevel SD-ADC is decisively determined by the linearity of the internal DAC 3. The DAC 3 generally comprises N standard cells which are activated or deactivated as a function of the thermometer code output signal (which has a width of N bits) of the quantizer. The standard cells are typically switchable standard current sources, the output signal of the DAC 3 resulting from the superimposition of the currents of the N standard current sources. Ideally, the standard cells of the DAC 3 are completely identical. However, in the case of a real DAC, the standard cells differ slightly, i.e. the output currents of the standard current sources are not completely identical in the activated state. A so-called "mismatch" thus occurs. This gives rise to non-linear distortion of the output signal of the DAC 3. In the case of discrete frequencies ("spurious frequencies"), this results in interference components, which can generally no longer be filtered out, in the spectrum of the output signal of the SD-ADC.

In order to increase the linearity of the DAC 3, it is known practice to provide a so-called DEM block (DEM—dynamic element matching; frequently also referred to as a randomizer or scrambler block) on the input side of the DAC 3, said block dynamically scrambling the thermometer code of the output signal of the quantizer 2, i.e. swapping the digits of the code signal. In this case, a code signal "0011100" is generated, for example, from a thermometer code "1110000" having a width of 7 bits. For a particular output signal of the quantizer 2, it is thus not always the same standard cells but rather different standard cells of the DAC 3 which are activated at different times, the number of active standard cells remaining constant. The linearity error is reduced in this manner.

FIG. 2 illustrates a block diagram of a multilevel SD-ADC having an additional DEM block 4 for code scrambling. Signals and circuit components which are provided with the same reference symbols in FIG. 1 and FIG. 2 correspond to one another. The ADC illustrated in FIG. 2 has N=7 quantization thresholds which correspond to the seven references REF0–REF6, where REFi<REFi+1. Each of the references REFi is assigned to a comparator 5.i which receives the corresponding reference REFi via the inverted input. The references are typically voltage references which are derived from the node voltages of a resistor string. However, current references may also be used instead of voltage references.

The output signal Qi (which has been sampled using an additional D-type flip-flop 6.i) of each comparator 5.i has a logic 1 if the input signal of the quantizer is greater than the corresponding reference REFi. Otherwise, the signal Qi corresponds to a logic 0. If the input signal of the quantizer is in the range of greater than REFj and less than REFj+1, all of the comparators 5.1 to 5.j provide a logic 1 at their output, while the comparators 5.j+1 to 5.N−1 generate a logic 0 at their output. The resultant code of the output signal Y (which has a width of N=7 bits and results from the combination of the binary signals Qi) of the quantizer is referred to as "thermometer code" because of the analogy to a liquid thermometer.

The output signal Y of the quantizer 2 is received by the DEM block 4, the individual digits of the signal Y being scrambled in the DEM block, as already explained above. In order to carry out code scrambling, the DEM block 4 comprises a digital logic unit which has a delay time or latency, i.e. the output signal of the DEM block 4 only reacts to a change in the signal Y with a certain delay. In the control loop, this latency acts as dead time and impairs the stability properties of the control loop.

The document U.S. Pat. No. 6,346,898 B1 discloses that impairment of the stability of the control loop, which is associated with code scrambling, can be circumvented if—instead of a DEM block 4 between the output of the quantizer 2 and the input of the DAC 3—a DEM block 4' is placed upstream of the inverting inputs of the quantizer 2. The resultant SD-ADC is illustrated in FIG. 3, signals and circuit components which are provided with the same reference symbols in FIG. 2 and FIG. 3 corresponding to one another. In the SD-ADC illustrated in FIG. 3, the DEM block 4' is used to dynamically scramble the assignment of the references REFi to the comparators 5.i. This means that, for a particular input signal of the quantizer 2, different bits Qi of the signal Y and thus, as in FIG. 3, also different standard cells of the DAC 3 are activated at different times.

The effect of the DEM block 4' which is outside the control loop in FIG. 3 is thus analogous to that of the DEM block 4 from FIG. 2 which is arranged inside the control loop, although the DEM block 4' illustrated in FIG. 3 is not associated with any additional dead time inside the control loop. In contrast to the DEM block 4 illustrated in FIG. 2, the DEM block 4' illustrated in FIG. 3 thus does not reduce the stability of the control loop.

FIG. 4 indicates an implementation example of the DEM block 4' illustrated in FIG. 3. Signals and circuit components which are provided with the same reference symbols in FIG. 4 and FIG. 3 correspond to one another. In this case, it should be taken into account that, for reasons of a simplified illustration, only the scrambling of 4 of the total of 7 references REFi is illustrated. The DEM block 4' comprises a switching network 7 which can be used to assign each individual reference REFi to each comparator 5.$i$. The switching network 7 is controlled using a control apparatus 8, the control apparatus 8 providing a digital control signal 9 for controlling the dynamic assignment between the references REFi and the comparators 5.$i$ via the switching network 7. In this case, the digital control signal 9 is obtained in the control apparatus 8 as a function of the output signal Y of the quantizer 2. The control apparatus 8 generates a control signal 9 such that, on average, all of the bits Qi have a logic 1 equally often, with the result that all of the standard cells of the DAC 3 are used equally often.

As regards the implementation of the control apparatus, the document U.S. Pat. No. 6,346,898 B1 cited above indicates a very complicated implementation example which comprises a multiplicity of individual circuit blocks (cf. FIG. 3 and column 3, lines 61 and 62, of the document U.S. Pat. No. 6,346,898 B1). In this case, the complicated implementation of the control apparatus 8 is based on the idea of selecting, from the total number of N standard cells of the DAC 3, precisely those m standard cells (where m depends on the input signal of the quantizer 2 at the time k) which have the greatest need for activation at any time k (cf. column 2, lines 23 to 31, in the document U.S. Pat. No. 6,346,898 B1). The need for activation of a standard cell of the DAC 3 depends on the previous overall use of the respective standard cell of the DAC 3, that standard cell which was previously used least having the greatest need for activation.

SUMMARY

Therefore, it is an object of the invention to specify a control apparatus which is intended to control the dynamic assignment of individual references to individual comparators of a quantizer in an SD-ADC and can be implemented with a considerably lower degree of complexity in comparison with the prior art. In this case, the controller should ensure that the standard cells of the DAC are activated, on average, equally often. The invention is also aimed at providing a corresponding method for controlling the dynamic assignment. In addition, the invention is aimed at specifying an SD-ADC in which the individual references are dynamically assigned to the individual comparators with as little circuit complexity as possible, the standard cells of the DAC being activated, on average, equally often.

The formulated objects on which the invention is based can be achieved by a control apparatus which is intended to control the dynamic assignment of N individual references to N individual comparators of a quantizer in a sigma-delta analogue/digital converter, wherein the control apparatus is operable to generate a first digital control signal for controlling the dynamic assignment, and the control apparatus comprises: a storage means for providing the value of the first control signal at the time k−1, and a summation means for summing the output signal of the quantizer with that value of the first control signal which is present at the time k−1 for the purpose of indicating the value of the first control signal at the time k.

The control apparatus for indicating the first control signal may also comprises a means for carrying out a modulo N operation, said means receiving the output signal of the summation means. The control apparatus may comprise a code converter which is designed to convert the representation of the values of the output signal of the quantizer from a thermometer code representation into a binary code representation. The control apparatus can be operable to indicate a second control signal and comprises a 1-of-N decoder which outputs the second control signal, the second control signal being a signal having a width of N bits, and precisely one bit of the N bits either having a logic 1 or, in an alternative refinement of the 1-of-N decoder, having a logic 0 as a function of the first control signal. The storage means may comprise a number of D-type flip-flops which corresponds to the bit width of the first control signal.

The object can also be achieved by a sigma-delta analogue/digital converter comprising a quantizer having N comparators, a reference generator for generating N references, a switching network for dynamically assigning the N individual references to the N individual comparators, and a control device as described above for controlling the switching network.

The switching network may comprise a respective switching group of N switching elements for each reference, the input of each switching element of a switching group respectively receiving the same reference, and the output of each switching element of a switching group being connected to a respective different comparator. The switching network can be driven by the second control signal, each bit of the second control signal determining the switching position of precisely one switching element in each switching group.

The object can also be achieved by a method for controlling the dynamic assignment of N individual references to N individual comparators of a quantizer in a sigma-delta analogue/digital converter, the method being used to generate a first digital control signal for controlling the dynamic assignment, and the method for generating the value of the first control signal at the time k comprising the following sequence of steps:

a) summing the output signal of the quantizer with that value of the first control signal which is present at the time k−1;

b) indicating the value of the first control signal at the time k as a function of the summation result in step a); and c) storing the value of the first control signal at the time k.

The sequence of steps also may comprise the following step which is carried out after step a) in terms of time:

carrying a modulo N operation out for the summation result in step a).

The inventive control apparatus according to an embodiment is intended to control the dynamic assignment of N individual references to N individual comparators of a quantizer in an SD-ADC. The control apparatus generates a first digital control signal for controlling the dynamic assignment. The control apparatus comprises a storage means for providing the value of the first control signal at the time k−1. By way of example, the storage means comprises a number of D-type flip-flops which corresponds to the bit width of the first control signal. In addition, a summation means which is used to sum the output signal of the quantizer with the stored value of the first control signal at the time k−1 is provided in the control apparatus. The value of the first control signal at the time k depends on the output signal of the summation means.

The control apparatus thus generates the current value of the first control signal as a function of the sum of the previous value of the control signal and the output signal of the quantizer, i.e. the control apparatus is based on an integrator. In this case, it is conceivable for the output signal of the quantizer to first of all be delayed by one or more time steps before summation. The inventive control apparatus can be used to achieve the situation in which the assignment of the references to the individual comparators and thus also the selection of the standard cells of the DAC rotate about the value of the output signal of the quantizer for each time step. If, when a constant value of the output signal of the quantizer of, for example, 2 (corresponds to "1100000" in the thermometer code representation) is taken into account, the 2 first of a total of 7 standard cells are activated at a time k=1, the 3rd and 4th standard cells are activated at the time k=2 and the 5th and 6th standard cells are activated at the time k=3. As can be understood from the example, the inventive control device makes it possible for the standard cells of the DAC to be activated, on average, equally often, with the result that the error of the DAC results, on average, in the value 0. A complicated calculation of the need as described in the prior art is not required for this.

It shall be pointed out that the representation of the values of the output signal of the quantizer is advantageously first of all adapted using a code converter before summation. Since the value of the output signal of the quantizer is generally in the thermometer code representation, the control apparatus advantageously comprises such a code converter which is designed to convert the representation of the values of the output signal of the quantizer from a thermometer code representation into a binary code representation. It is thus possible to evaluate the value of the output signal of the quantizer in binary code with as little circuit complexity as possible in the control device. In particular, this reduces the bus width within the control device from N bit lines for a thermometer code signal to ceil(ld(N+1)) bit lines for a binary code signal, the function ceil(i) describing the smallest natural number greater than i. As regards the code converter, it should be pointed out that the thermometer code rotates as a function of the instantaneous assignment of the references. The rotation of the thermometer code is of no significance to the code converter if the latter determines only the number of logic ones in the thermometer code signal.

The control apparatus for indicating the first control signal also advantageously comprises a means for carrying out a modulo N operation, said means receiving the output signal of the summation means. In the context of the application, a modulo N operation is understood as meaning the indication of the remainder when dividing by N. If the output signal of the summation means provides the value 7, for example, a value of 0 results in the case of a modulo 7 operation. The means for carrying out the modulo N operation is used to limit the output signal of the summation means, it being ensured that the output signal of the summation means is always mapped to a range of values of from 0 to N−1. The provision of a modulo N operation is expedient against the background that the number of standard cells in the DAC is not arbitrary but is typically restricted to N standard cells. If, when a constant value of the output signal of the quantizer of, for example, 2 is taken into account, the last two standard cells of a total of 7 standard cells are activated at a time k=1, the modulo N operation can be used to activate the first two standard cells at the time k=2.

The control apparatus for indicating a second control signal advantageously comprises a 1-of-N decoder. The second control signal which is output by the 1-of-N decoder is a signal having a width of N bits, precisely one bit of the N bits either having a logic 1 or, in an alternative refinement of the 1-of-N decoder, having a logic 0 as a function of the first control signal. The other bits of the second control signal then have a logic 0 or a logic 1. The second control signal can be used to control the switching network in a particularly simple manner, as described in even more detail below.

The inventive SD-ADC according to another embodiment comprises a quantizer having N comparators, and a reference generator, in particular a voltage generator, for generating N references. A switching network for dynamically assigning the N individual references to the N individual comparators is also provided in the SD-ADC. An inventive control device (as described above) is used to control the switching network.

According to one advantageous refinement of the inventive SD-ADC, the switching network comprises a respective switching group of N respective switching elements for each reference. In this case, the input of each switching element of a switching group respectively receives the same reference, and the output of each switching element of a switching group is connected to a respective different comparator.

In this case, the control device advantageously has a 1-to-N decoder (as already described above), the second control signal which is generated by the 1-to-N decoder driving the switching network. In this case, each bit of the second control signal determines the switching position of precisely one switching element in each switching group. If, for example, the second control signal for N=7 has the value "0010000" (or alternatively "1101111"), each third switching element in each switching group is closed, while the other switching elements are open.

The inventive SD-ADC is advantageously a so-called continuous-time SD-ADC, i.e. the loop filter of the SD-ADC (see the loop filter 1 in FIG. 3) is a continuous-time filter whose output value is valid during the entire period of time. In contrast, so-called switched-capacitor SD-ADCs whose loop filters comprise switched capacitors for emulating resistive filter components are disclosed in the prior art, the output signal being valid only at particular times.

The inventive method according to another embodiment is used to control the dynamic assignment of N individual references to N individual comparators of a quantizer in an SD-ADC. The method is used to generate a first digital control signal for controlling the dynamic assignment. In order to generate the value of the first control signal at the time k, the output signal of the quantizer and the stored value of the first control signal at the time k−1 are summed in a first step. The value of the first control signal at the time k is then obtained as a function of the summation result. In addition, the value of the first control signal at the time k is stored, so that this value can be taken into account when generating the value of the first control signal at the time k+1.

BRIEF DESCRIPTION OF THE DRAWINGS

The invention will be explained in more detail below using an exemplary embodiment and with reference to the drawings, in which.

DETAILED DESCRIPTION

Figure 1:
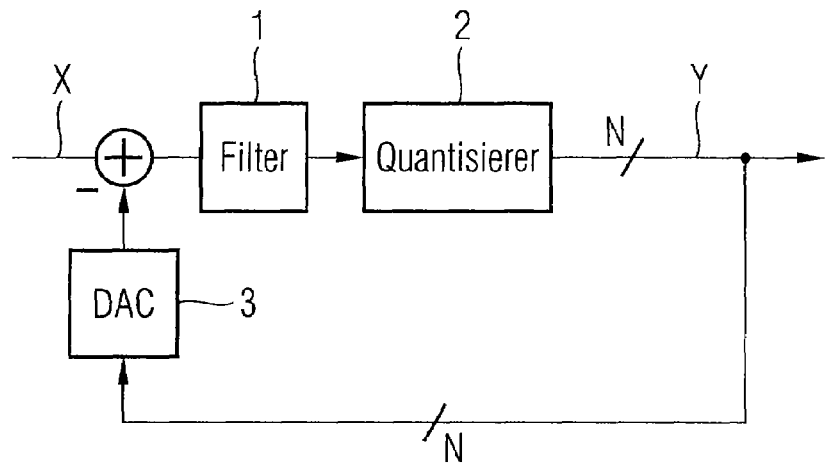
FIG. 1 shows a block diagram of an SD-ADC (prior art)
Figure 2:
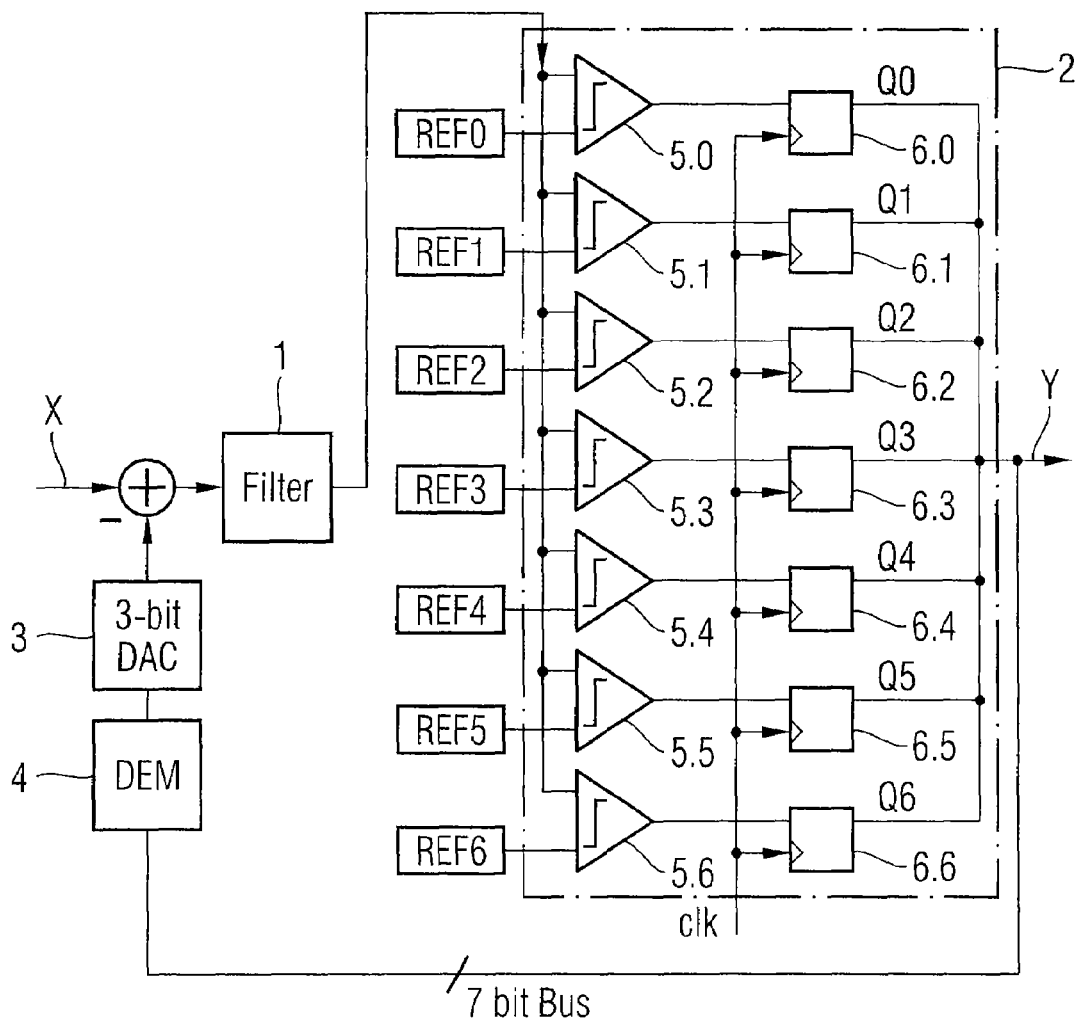
FIG. 2 shows a block diagram of a multilevel SD-ADC having an additional DEM block for code scrambling inside the control loop (prior art)
Figure 3:
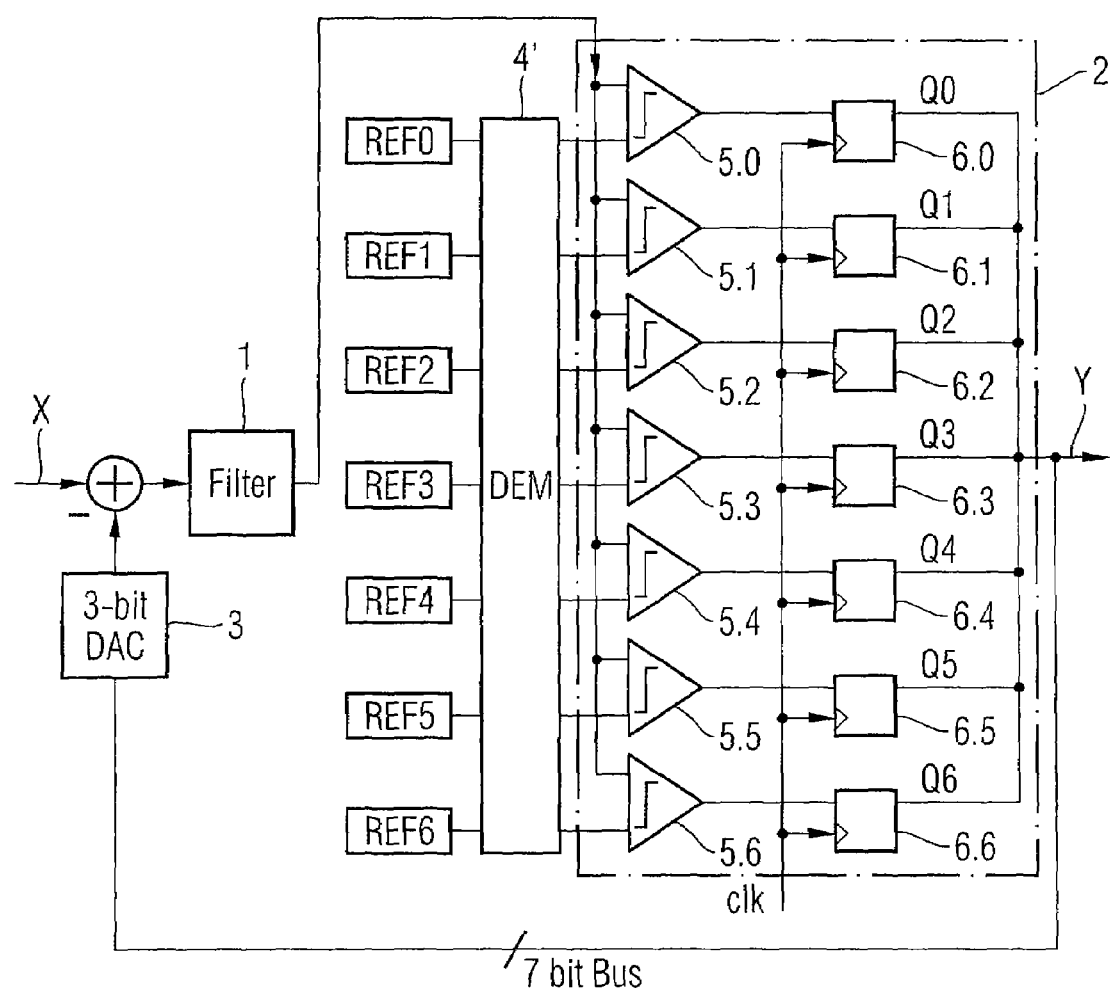
FIG. 3 shows a block diagram of a multilevel SD-ADC having an additional DEM block for code scrambling outside the control loop (prior art)
Figure 4:
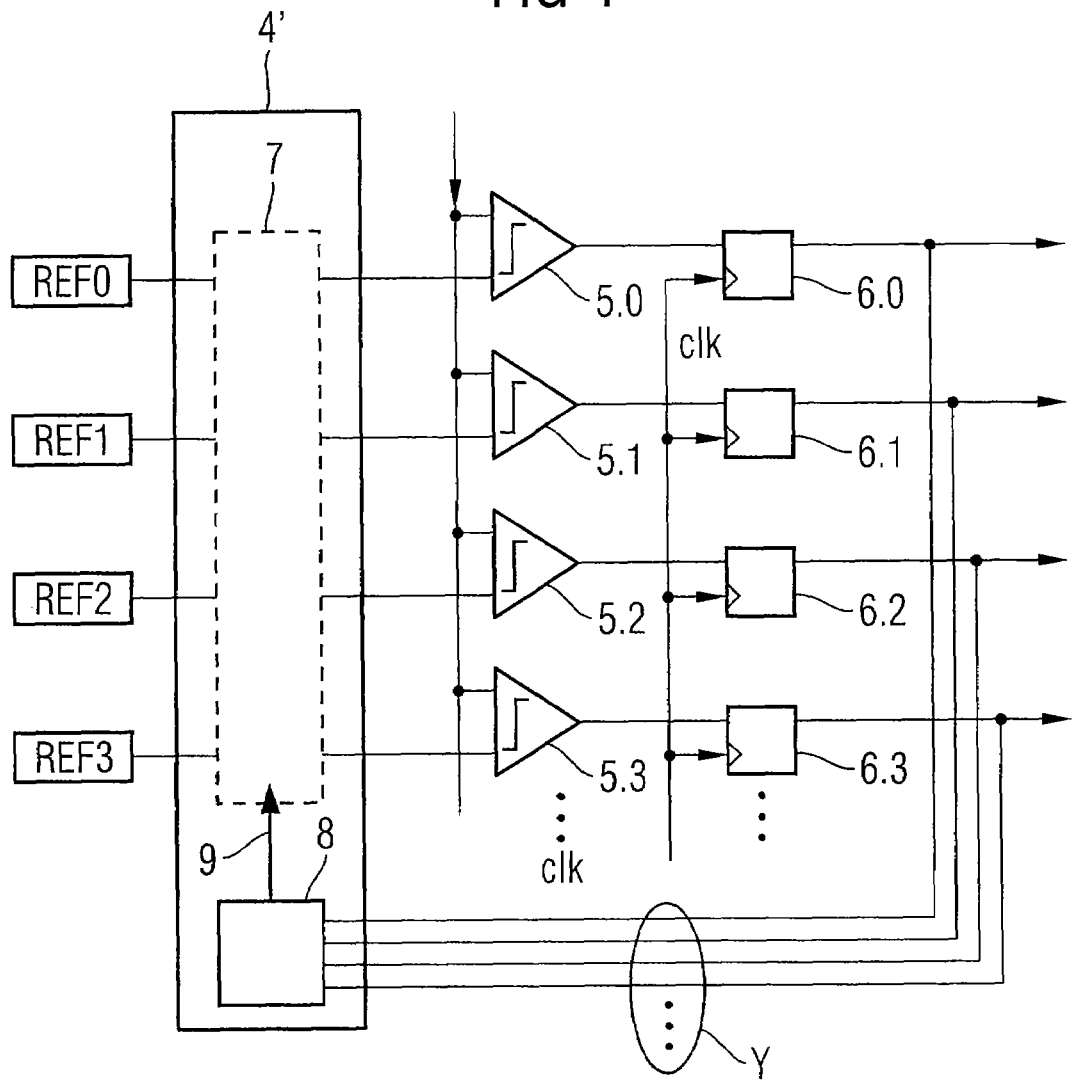
FIG. 4 shows a basic circuit diagram for the DEM block illustrated in FIG. 3 (prior art)
Figure 5:
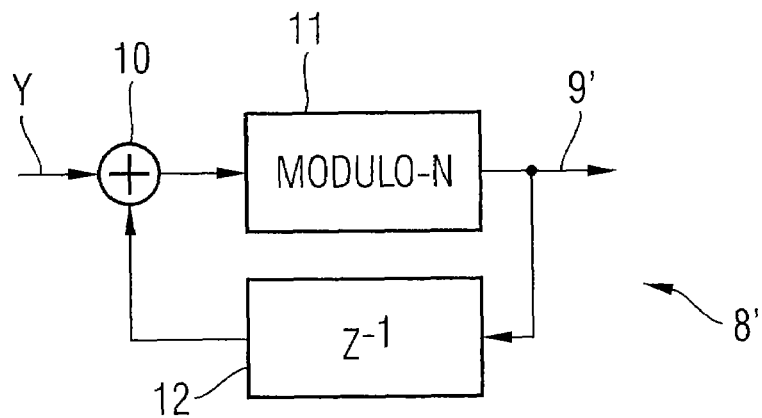
FIG. 5 shows a basic circuit diagram of the inventive control apparatus as part of the DEM block.

FIG. 5 indicates a basic circuit diagram of the inventive control apparatus 8' (corresponds to the control apparatus 8 in FIG. 4) as part of a DEM block as illustrated in FIG. 3. In this case, the values of the output signal Y of the quantizer are used to generate a random sequence for controlling the DEM block. The control apparatus 8' comprises a feedback loop comprising a summer 10, a means 11 for carrying out the modulo N operation and a delay means or storage means 12. The output signal Y of the quantizer 2 is injected into the input of the control apparatus 8'. The values of the output signal Y of the quantizer 2 are preferably first of all converted from the thermometer code representation into the binary code representation using a code converter (not illustrated). The summer 10 sums the value of the output signal Y of the quantizer with the value of the control signal which has been delayed by one time step. The output signal of the summer 10 is subjected to a modulo N operation in the means 11, as a result of which the resultant control signal 9' remains restricted to the values of from 0 to N−1. The control signal 9' is delayed by one time step using the delay means 12 and is fed back to the input of the control apparatus 8'. A 1-of-N decoder (not illustrated) which is driven by the control signal 9' and generates the control signal 9 (cf. FIG. 4) that directly drives the switching elements of the switching network 7' is typically provided at the output of the control apparatus 8'.

The control apparatus 8' illustrated in FIG. 5 is thus based on an integrator with modulo N limitation of the range of values. Alternatively, the control apparatus may also be interpreted as a modulo N counter (i.e. having a total of N counter readings), the change in the counter reading depending on the value of the output signal Y of the quantizer 2.

Figure 6:
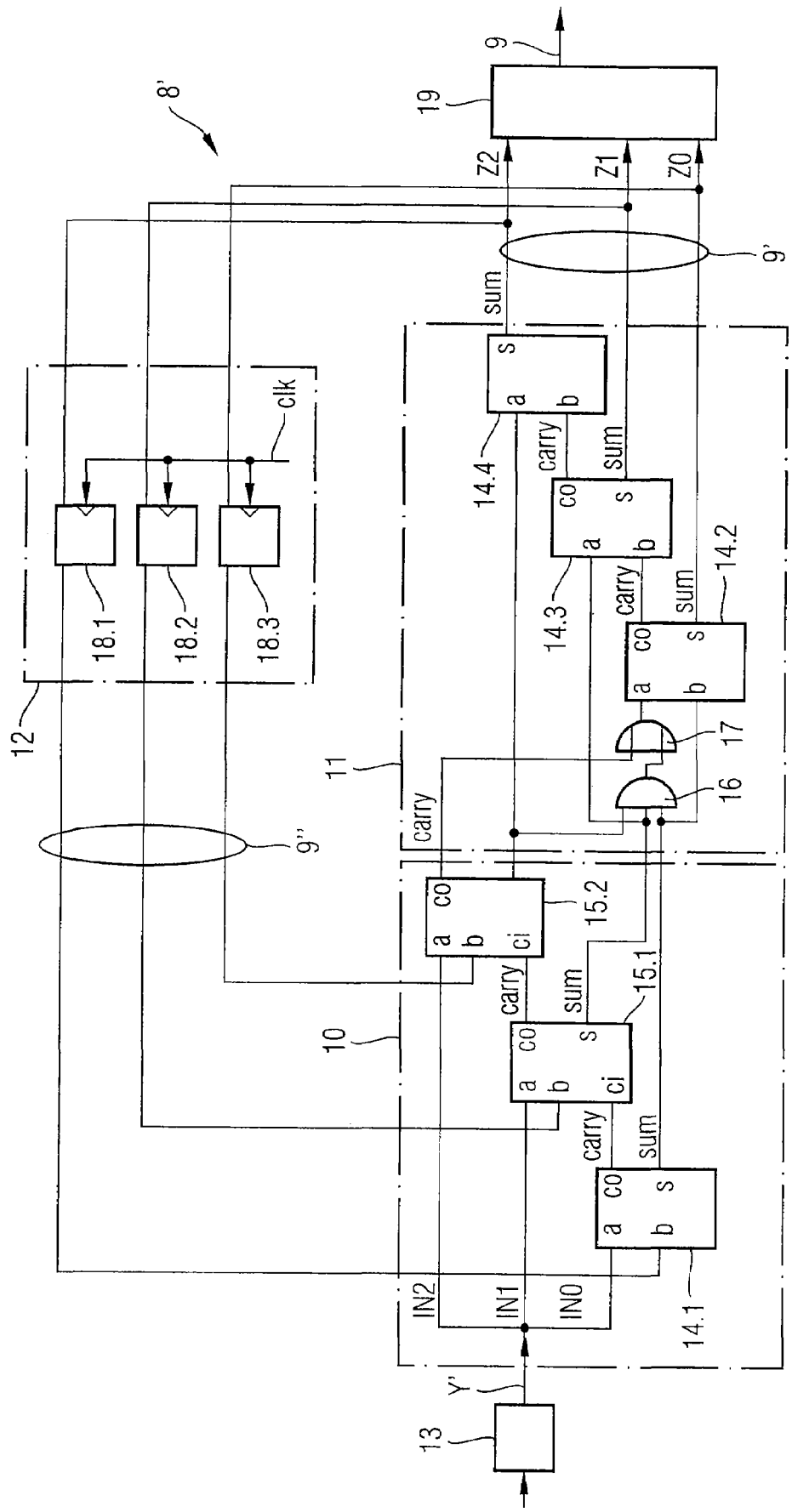
FIG. 6 shows a specific implementation example of the inventive control apparatus as part of the DEM block.

FIG. 6 illustrates a specific implementation example of the inventive control apparatus 8' for N=7 comparators. Signals and circuit components which are provided with the same reference symbols in FIG. 5 and FIG. 6 correspond to one another. The control apparatus has a code converter 13 which converts the values of the output signal Y of the quantizer 2 from a thermometer code representation having N=7 bits into the binary code representation having ceil(ld (N+1))=3 bits. In this case, the thermometer code is rotated as a function of the instantaneous assignment of the references. The rotation of the thermometer code is of no significance to the code converter 13 if the latter determines only the number of logic ones in the thermometer code signal. The output signal Y' (whose representation has been converted) of the quantizer 2 is added, in the 3-bit adder 10, to the control signal 9''' which has been delayed by one time step. The 3-bit adder 10 comprises a half-adder 14.1 and two full-adders 15.1 and 15.2. The inputs a, b, ci receive the two summands and the carry bit (carry in), respectively, while the outputs s and co output the sum bit and the carry bit, respectively. A full-adder differs from a half-adder by virtue of the fact that, in contrast to the half-adder, the full-adder has an input for receiving the carry bit ci. The output of the 3-bit adder 10 has a width of 4 bits, as a result of which values of from 0 to 13 (the values 14 and 15 do not occur), which may occur when adding the signals Y' and 9''' having a width of 3 bits, can be coded. The means 11 for carrying out the modulo N operation use the output signal (which has a width of 4 bits and has the range of values of from 0 to 13) of the 3-bit adder 10 to generate a control signal 9' which has a width of 3 bits and has a range of values of from 0 to 6, i.e. the values of the control signal 9' are restricted to modulo 7 values. To this end, the means 11 comprises three half-adders 14.2–14.4, an AND gate 16 and an OR gate 17. Three D-type flip-flops 18.1–18.3 are used to delay the control signal 9' by one clock cycle, precisely one D-type flip-flop 18.i being assigned to each bit line of the control signal 9'. A 1-of-N decoder 19 which is driven by the control signal 9' and generates the control signal 9 that directly controls the switching elements of the switching network 7' is provided at the output of the control apparatus 8'.

The control signal 9 which is output by the 1-of-N decoder is a signal having a width of N=7 bits, precisely one single bit of the total of 7 bits having a logic 1 as a function of the first control signal. Table 1 indicates the assignment between the values of the control signal 9' and the values of the control signal 9.

TABLE 1

| Value of the signal 9' (Binary representation: Z0/Z1/Z2) | Value of the signal 9 |
|---|---|
| 0 ("000") | "1000000" |
| 1 ("001") | "0100000" |
| 2 ("010") | "0010000" |
| 3 ("011") | "0001000" |
| 4 ("100") | "0000100" |
| 5 ("101") | "0000010" |
| 6 ("110") | "0000001" |

Figure 7:
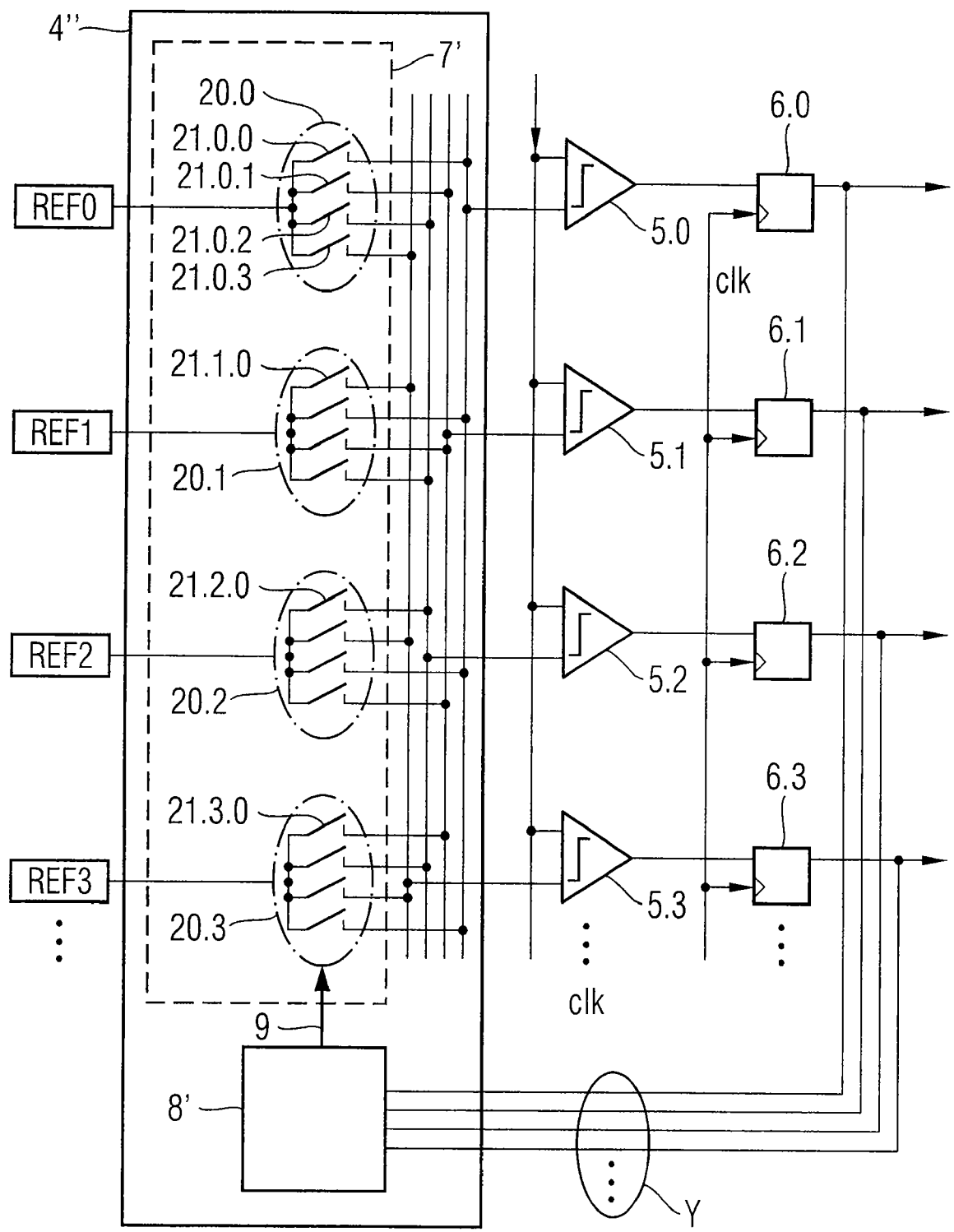
FIG. 7 shows a circuit diagram of the DEM block as part of an inventive SD-ADC.

FIG. 7 shows a circuit diagram of an inventive DEM block 4'' as part of an inventive SD-ADC, the DEM block 4'' comprising the inventive control apparatus 8' as shown in FIG. 6. In this case, it should be taken into account that, as in FIG. 4, only the scrambling of 4 of the total of 7 references REFi is illustrated for reasons of a simplified illustration. The DEM block 4'' comprises the switching network 7' which can be used to assign each individual reference REFi to each comparator 5.i. The switching network 7' is controlled using the inventive control apparatus 8', the control apparatus 8' generating the digital control signal 9 for controlling the switching network 7'.

The switching network 7' comprises a respective switching group 20.i of N=7 (only 4 illustrated) switching elements 21.i.j for each reference REFi, the input of each switching element 21.*i.j* of a switching group 20.*i* respectively receiving the same reference REFi, and the output of each switching element 20.*i.j* of a switching group 20.*k* being connected to a respective different comparator 5.*k*. Each bit of the control signal 9 determines the switching position of precisely one switching element 21.*i.j* in each switching group 20.*i*. If the jth bit of the control signal 9 has a logic 1, the jth switching element 21.*i.j* of each switching group 20.*i* is closed; otherwise the jth switching element 21.*i.j* of each switching group 20.*i* is open. It would also be conceivable for the relationship between the switching position of a switching element 21.*i.j* and the respective bit of the control signal 9 to be exactly reversed. In this case, the 1-of-N decoder 19 would have to be configured in such a manner that precisely one bit of the control signal 9 has a logic 0 instead of a logic 1.

Figure 8:
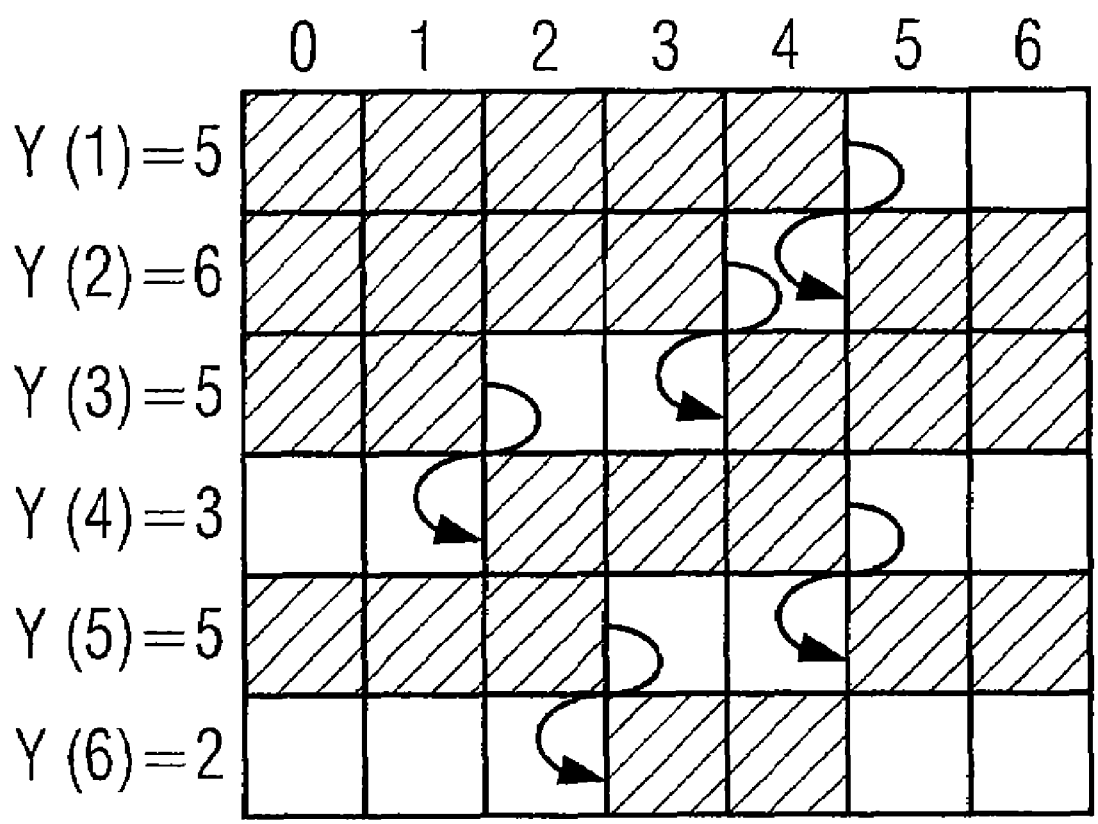
FIG. 8 shows scrambling of the references REFi for a sequence of exemplary output values of the quantizer. Reference is made to the introduction to the description as regards FIGS. 1 to 4 which relate to the prior art.

FIG. 8 illustrates the resultant scrambling of the references REFi for the sequence {Y(k)}={5; 6; 5; 3; 5; 2} of exemplary output values of the quantizer 2. In this case, it shall be noted that a value Y(k) describes only the number of logic ones but not their distribution. In this case, each row of boxes illustrated in FIG. 8 is assigned to one time step k. In addition, the ith column is respectively assigned to the ith comparator 5.*i* and to the ith standard cell in the DAC 3 that is driven by said comparator. In this case, a hatched box indicates that the associated comparator 5.*i* outputs a logic 1, as a result of which that standard cell in the DAC 3 which is driven by the comparator 5.*i* is activated. Conversely, a box which is not hatched means that the associated comparator 5.*i* outputs a logic 0 and that standard cell in the DAC 3 which is driven by the comparator 5.*i* is deactivated.

At the initial time k=1, the ith reference REFi is assigned to precisely the ith comparator 5.*i*. In the case of a correspondingly large value of the quantizer input signal, the first 5 comparators 5.0 to 5.4 provide a logic 1 at the output. The assignment of the references is then rotated about the value of the output signal Y(1)=5 (indicated by the arrow), with the result that the comparator 5.5 is assigned to the reference REF0, the comparator 5.6 is assigned to the reference REF1, the comparator 5.0 is assigned to the reference REF2 etc. That output value Y(2)=6 of the quantizer 2 which results at the time k=2 determines the subsequent rotation of the assignment of the references, starting from the existing assignment. The assignment of the references rotates through Y(2)=6 steps, with the result that the comparator 5.4 is assigned to the reference REF0, the comparator 5.5 is assigned to the reference REF1 etc. The references REFi for the subsequent time steps are scrambled in an analogous manner. Rotation (as illustrated in FIG. 6) of the assignment of the references is also referred to as "barrel-shifting".

The distribution of the hatched boxes for the time steps k=1, k=3 and k=5 reveals that, in spite of the same value of the output signal Y of the quantizer 2, different standard cells in the DAC 3 are respectively activated.

Finally, it shall be pointed out that the above statements can be applied, in an analogous manner, to quantizers having any desired number N of comparators 5.*i* and references REFi and are not restricted to the case of N=7 comparators 5.*i* and references REFi.

What is claimed is:

1. A control apparatus which is intended to control the dynamic assignment of N individual references to N individual comparators of a quantizer in a sigma-delta analogue/digital converter, wherein
    the control apparatus is operable to generate a first digital control signal for controlling the dynamic assignment, and
    the control apparatus comprises:
        a storage means for providing the value of the first control signal at the time k−1, and
        a summation means for summing the output signal of the quantizer with that value of the first control signal which is present at the time k−1 for the purpose of indicating the value of the first control signal at the time k;
    wherein the control apparatus for indicating the first control signal also comprises a means for carrying out a modulo N operation, said means receiving the output signal of the summation means.

2. A control apparatus according to claim 1, wherein the control apparatus comprises a code converter which is designed to convert the representation of the values of the output signal of the quantizer from a thermometer code representation into a binary code representation.

3. A control apparatus according to claim 1, wherein the control apparatus is operable to indicate a second control signal and comprises a 1-of-N decoder which outputs the second control signal, the second control signal being a signal having a width of N bits, and precisely one bit of the N bits either having a logic 1 or, in an alternative refinement of the 1-of-N decoder, having a logic 0 as a function of the first control signal.

4. A control apparatus according to claim 1, wherein the storage means comprises a number of D-type flip-flops which corresponds to the bit width of the first control signal.

5. A sigma-delta analogue/digital converter comprising a control device according to claim 1, further comprising:
    a quantizer having N comparators,
    a reference generator for generating N references, and
    a switching network for dynamically assigning the N individual references to the N individual comparators; wherein
    the control device controls the switching networks;
    wherein the switching network comprises a respective switching group of N switching elements for each reference, the input of each switching element of a switching group respectively receiving the same reference, and the output of each switching element of a switching group being connected to a respective different comparator.

6. A sigma-delta analogue/digital converter according to claim 5, wherein
    the control device is operable to indicate a second control signal and comprises a 1-of-N decoder which outputs the second control signal, the second control signal being a signal having a width of N bits, and precisely one bit of the N bits either having a logic 1 or, in an alternative refinement of the 1-of-N decoder, having a logic 0 as a function of the first control signal, and
    the switching network is driven by the second control signal, each bit of the second control signal determining the switching position of precisely one switching element in each switching group.

7. A method for controlling the dynamic assignment of N individual references to N individual comparators of a quantizer in a sigma-delta analogue/digital converter, the method being used to generate a first digital control signal for controlling the dynamic assignment, and the method for generating the value of the first control signal at the time k comprising the following sequence of steps:
    a) summing the output signal of the quantizer with that value of the first control signal which is present at the time k−1;

b) indicating the value of the first control signal at the time k as a function of the summation result in step a); and
c) storing the value of the first control signal at the time k.

8. A method according to claim 7, wherein the sequence of steps also comprises the following step which is carried out after step a) in terms of time:
carrying a modulo N operation out for the summation result in step a).

9. A method according to claim 7, further comprising the step of converting the representation of the values of the output signal of the quantizer from a thermometer code representation into a binary code representation.

10. A method according to claim 1, further comprising the step of outputting a second control signal, wherein the second control signal is a signal having a width of N bits, and precisely one bit of the N bits either having a logic 1 or, alternatively, having a logic 0 as a function of the first control signal.

11. A control apparatus which is intended to control the dynamic assignment of N individual references to N individual comparators of a quantizer in a sigma-delta analogue/digital converter, wherein
the control apparatus is operable to generate a first digital control signal for controlling the dynamic assignment, and
the control apparatus comprises:
a storage means for providing the value of the first control signal at the time k−1, and
a summation means for summing the output signal of the quantizer with that value of the first control signal which is present at the time k−1 for the purpose of indicating the value of the first control signal at the time k;
wherein the control apparatus comprises a code converter which is designed to convert the representation of the values of the output signal of the quantizer from a thermometer code representation into a binary code representation.

12. A control apparatus according to claim 11, wherein the control apparatus for indicating the first control signal also comprises a means for carrying out a modulo N operation, said means receiving the output signal of the summation means.

13. A control apparatus according to claim 11, wherein the control apparatus is operable to indicate a second control signal and comprises a 1-of-N decoder which outputs the second control signal, the second control signal being a signal having a width of N bits, and precisely one bit of the N bits either having a logic 1 or, in an alternative refinement of the 1-of-N decoder, having a logic 0 as a function of the first control signal.

14. A control apparatus according to claim 11, wherein the storage means comprises a number of D-type flip-flops which corresponds to the bit width of the first control signal.

15. A control apparatus which is intended to control the dynamic assignment of N individual references to N individual comparators of a quantizer in a sigma-delta analogue/digital converter, wherein
the control apparatus is operable to generate a first digital control signal for controlling the dynamic assignment, and
the control apparatus comprises:
a storage means for providing the value of the first control signal at the time k−1, and
a summation means for summing the output signal of the quantizer with that value of the first control signal which is present at the time k−1 for the purpose of indicating the value of the first control signal at the time k;
wherein the control apparatus is operable to indicate a second control signal and comprises a 1-of-N decoder which outputs the second control signal, the second control signal being a signal having a width of N bits, and precisely one bit of the N bits either having a logic 1 or, in an alternative refinement of the 1-of-N decoder, having a logic 0 as a function of the first control signal.

16. A control apparatus according to claim 15, wherein the control apparatus for indicating the first control signal also comprises a means for carrying out a modulo N operation, said means receiving the output signal of the summation means.

17. A control apparatus according to claim 15, wherein the control apparatus comprises a code converter which is designed to convert the representation of the values of the output signal of the quantizer from a thermometer code representation into a binary code representation.

18. A control apparatus according to claim 11, wherein the storage means comprises a number of D-type flip-flops which corresponds to the bit width of the first control signal.

19. A control apparatus which is intended to control the dynamic assignment of N individual references to N individual comparators of a quantizer in a sigma-delta analogue/digital converter, wherein
the control apparatus is operable to generate a first digital control signal for controlling the dynamic assignment, and
the control apparatus comprises:
a storage means for providing the value of the first control signal at the time k−1, wherein the storage means comprise a number of D-type flip-flops which corresponds to the bit width of the first control signal, and
a summation means for summing the output signal of the quantizer with that value of the first control signal which is present at the time k−1 for the purpose of indicating the value of the first control signal at the time k.

* * * * *